United States Patent [19]
Roberts et al.

[11] 3,969,543
[45] July 13, 1976

[54] METHOD OF PROVIDING A PATTERNED LAYER OF SILICON-CONTAINING OXIDE ON A SUBSTRATE

[75] Inventors: Edward David Roberts, Purley, England; Jan Frederik Steggerda, Eindhoven, Netherlands

[73] Assignee: U.S. Philips Corporation, New York, N.Y.

[22] Filed: Sept. 26, 1974

[21] Appl. No.: 509,493

[30] Foreign Application Priority Data
Oct. 1, 1973 United Kingdom............... 45771/73

[52] U.S. Cl................................ 427/54; 96/35.1; 96/36.2; 204/159.13; 427/273
[51] Int. Cl.².......................................... B05D 3/06
[58] Field of Search ................. 427/43, 54, 95, 270, 427/271, 272, 273; 96/35.1, 36.2; 204/159.13

[56] References Cited
UNITED STATES PATENTS

| | | | |
|---|---|---|---|
| 3,272,670 | 9/1966 | Myers | 427/43 |
| 3,726,710 | 4/1973 | Berger et al. | 204/159.13 |
| 3,825,466 | 7/1974 | Martin et al. | 156/13 |
| 3,847,771 | 11/1974 | McGinniss | 204/159.13 |
| 3,852,097 | 12/1974 | Owen et al. | 427/54 |
| 3,865,588 | 2/1975 | Ohto et al. | 204/159.13 |
| 3,873,499 | 3/1975 | Michael et al. | 204/159.13 |
| 3,877,980 | 4/1975 | Martin et al. | 427/43 |

Primary Examiner—John H. Newsome
Attorney, Agent, or Firm—Frank R. Trifari; Norman N. Spain

[57] ABSTRACT

The invention relates to a method of providing a patterned silicon-containing oxide layer on a substrate, by providing a coating comprising a polymerizable siloxane material on the substrate, locally exposing the coating to radiation in accordance with the desired pattern, then developing the exposed coating and converting the siloxane material pattern into the patterned silicon-containing oxide layer.

15 Claims, 1 Drawing Figure

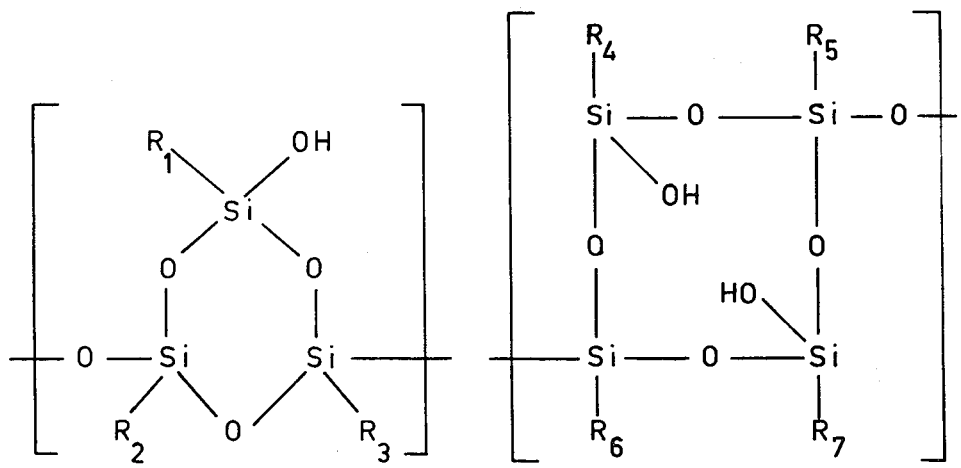
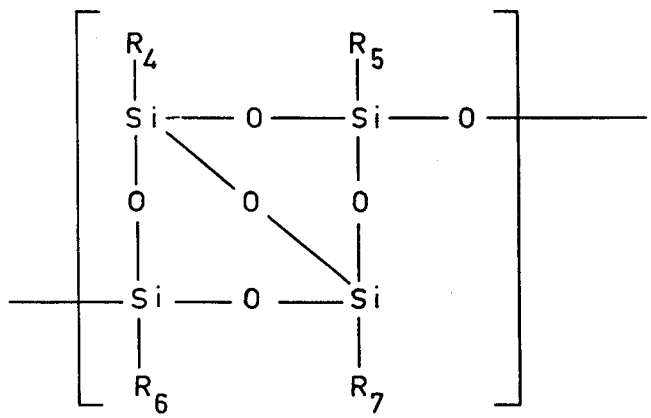
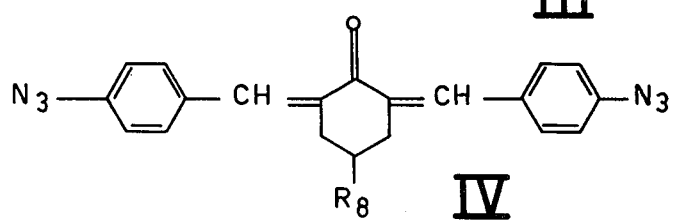
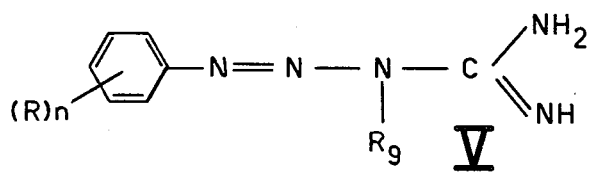

METHOD OF PROVIDING A PATTERNED LAYER OF SILICON-CONTAINING OXIDE ON A SUBSTRATE

BACKGROUND OF THE INVENTION

Patterned layers of silicon-containing oxide, for example silicon dioxide, may be used for various purposes. Notably in semiconductor technology, in particular planar semiconductor technology, such patterned layers of silicon-containing oxide are used as diffusion masks, as passivating layers, and/or as dielectric layers, such as in MOS-structures. In general, first the oxide layer is formed, after which the desired pattern is etched therein using a photoresist layer developed in the desired pattern on the oxide layer and a suitable etchant. The photoresist may be a polymerizable material which has been made sensitive to ultraviolet radiation by suitable additions.

However, in this known method defects and inaccuracies may occur which may be the result of undesired pores in the developed photoresist layer as a result of which the oxide layer is etched away at undesired places, and/or may be caused by underetching as a result of which inaccuracies in the dimensions of the apertures to be obtained in the patterned oxide layer may occur and the pits etched below the undesired pores may become unacceptably large.

It has already been proposed to obtain a more accurate definition of the resist layer by the use of particle radiation, for example electron beams, with which theoretically a better definition should be obtainable. However, this requires expensive equipment. Furthermore, the said possible defects as a result of pores and underetching are not avoided.

It has meanwhile been found that it is possible to influence siloxane-containing layers by means of local electron bombardment in such a manner that a difference in properties is formed between siloxane material thus bombarded and unbombarded siloxane material, it being possible to remove one of the said two materials while leaving the other material on a substrate. The resulting pattern of the siloxane-containing material may then be converted into silicon-containing oxide by heating in an oxygen-containing atmosphere, for example air. As no etching step is used, underetching cannot occur. Pores, if any, are small and may be closed during the conversion into the oxide or during a possible further after-treatment.

However, the drawback of the use of expensive equipment remains.

It has now been found possible to form a silicon-containing layer which is sensitive to ultraviolet radiation and which can be provided on a substrate in a given pattern using such radiation and a suitable mask, which pattern can be converted into a corresponding pattern of silicon-containing oxide.

DESCRIPTION OF THE INVENTION

The present invention provides a method of providing a patterned silicon-containing oxide layer on a substrate, the method comprising the steps of applying a coating comprising a polymerizable siloxane material and an ultra-violet-sensitive sensitizer to the substrate, exposing the coating to ultra-violet radiation in accordance with the desired pattern, then developing the exposed coating and converting the desired pattern containing the siloxane material into the desired pattern of the silicon-containing oxide layer. In this case the sensitizer is a material which is brought into an activated form by the ultra-violet radiation, in which form it is active by the transition of the siloxane material from a soluble into an insoluble form or from an insoluble into a soluble form in a given solvent. Preferably the irradiated sensitizer promotes polymerization of the siloxane material.

According to a preferred embodiment of the invention, a sensitizer may be used which, in an ultra-violet radiation-activated form, shows either an acid or a basic reactivity. Such an activated sensitizer may catalyze the formation of oxygen bridges between silicon atoms. This effect is particularly favorable in the case in which the siloxane material contains OH-groups bonded to silicon. In principle, silicon-bound hydrolyzable groups may also be used in the siloxane. In particular, sensitizers which are basic may be chosen from the triazines (diazoamino compounds). Notably, triazines in which the amino group belongs to a guanidine group are suitable, preferably a phenyldiazoguanidine, in particular having the general formula shown in formula V of the accompanying drawings, in which $(R)_n$ denotes a number of $n$ of substituents for hydrogen atoms of the phenyl group, $n$ being 0, 1, 2 or 3, and in which $R_9$ may be hydrogen or a substituent, preferably a methyl group. If $n$ is larger than 0, according to a preferred embodiment, alkyl groups having 1 to 20 carbon atoms, alkoxy groups having 1 to 4 carbon atoms, halogens, benzoyl groups or N-bonded morpholine groups may be chosen as substituents of $(R)_n$. When $n$ is larger than 1, the substituents of $(R)_n$ need not mutually be the same.

According to a further preferred embodiment, a sensitizer may be used which, after exposure to ultra-violet radiation, stimulates the formation of cross-links between organic groups. The siloxane material may contain one or more unsaturated carbon bonds, preferably carbon = carbon double bonds, in particular one or more vinyl groups or polymeric groups formed by polymerization by means of such unsaturated bonds. Such sensitizers are known per se for the use in photoresist materials. In particular azido compounds, preferably arylazido compounds (azides), may be chosen. Sensitizers of this type may form very reactive nitrenes as intermediate products when irradiated with ultra-violet radiation. The reactivity of such nitrenes is such that they also may stimulate the formation of cross-links between saturated organic groups, such as saturated hydrocarbon groups.

Polymerizable monomeric or partly polymerized siloxanes may be used. Furthermore, if desired, elements other than silicon and oxygen destined for the oxide may be added in a suitable form. Siloxanes having OH-groups bonded to silicon are suitable for polymerization by a condensation reaction. Cyclic siloxanes are preferably used, for example, having ring structures of Si-O groups. Such compounds may have a high density of silicon atoms so that the volume change upon conversion into silicon oxide is not so large that a very porous silicon oxide structure results after the conversion. Siloxanes having such structures may be obtained, for example, by hydrolysis of organotrichlorosilanes, in which the organo group is a hydrocarbon group which preferably has 1 to 2 carbon atoms and in particular is a methyl group or a vinyl group. A slight polymerization may subsequently be used, for example, with the aid of ammonia. The degree of polymerization then is preferably on an average 2–6 cyclosiloxane groups per poly (cyclosiloxane) molecule.

Formulae I, II and III of the accompanying drawing shows cyclosiloxane chain units which can be obtained, for example, in this manner in poly (cyclosiloxanes) from the above-mentioned organotrichlorosilanes. $R_1 - R_7$ represent hydrocarbon groups. In the case in which a single organotrichlorosilane is used and not a mixture, the groups $R_1 - R_7$ are the same.

The molecules furthermore may have an H- and OH-group at end-positions to give —OH groups at each end of a chain polymerized from these molecules.

Incorporation of elements other than silicon and oxygen in the oxide pattern to be manufactured, preferably by the addition to the siloxane material, may be carried out in several manners, for example in manners similar to methods having been proposed before and described in West German Offenlegungsschrift No. 2,302,148. It is possible, for example, in a manner analogous to a method as described therein to introduce such other element from another phase, for example gaseous or liquid phase, into the siloxane-containing layer before or after the formation of the pattern therein by means of the added sensitizer and ultra-violet radiation. It is also possible, for example analogous to another method described in said German Offenlegungsschrift, to mix such other element in a suitable form, preferably as a decomposable and/or a copolymerizable compound, with the siloxane and the sensitizer before providing it as a layer on the substrate.

It is also possible to cover the layer which has been exposed to ultra-violet radiation according to a desired pattern and contains the siloxane and the sensitizer, with a second polymerizable polysiloxane-containing layer, a local polymerization in said second layer being initiated by graft polymerization from the underlying ultra-violet radiation-exposed parts of the first siloxane-containing layer, for example, in a heat-treatment in an oxygen-free atmosphere. By means of a suitable development treatment the second layer is limited to those portions subjected to the graft polymerization. In this case also, elements other than silicon and oxygen to be incorporated in the oxide may be used. In this manner, for example, patterns which can be used in semiconductor technology and consisting of a lower silicon oxide layer and an upper phosphate glass layer can be obtained, for example in a manner analogous to a further method described in said German Offenlegungsschrift No. 2,302,148. It is also possible to accurately obtain a comparatively thin siloxane layer in a given pattern photographically by means of ultra-violet radiation and to increase its thickness by means of the second provided layer so as to obtain a desired layer thickness of the oxide pattern.

The method according to the invention is particularly suitable for use in the manufacture of semiconductor devices. The resulting oxide pattern may be subsequently removed but it is also possible for the pattern to be maintained entirely or partly in the semiconductor devices, for example, as an insulating, passivating and/or dielectric layer.

The invention also relates to products in the manufacture of which the method according to the invention has been used.

In order that the invention may be readily carried into effect, some embodiments of the method according to the invention will now be described with reference to the following Examples and to the accompanying drawing, in which formulae I to III are formulae of cyclosiloxane groups, and in which formula IV and V are formulae of sensitizers which may be used in the method according to the invention.

EXAMPLE 1

A slightly-pre-polymerized polyvinylcyclosiloxane mixture if prepared by hydrolysis of vinyltrichlorosilane followed by a treatment with a little ammonia, using the method described in United Kingdom patent specification No. 1,316,711. The polycyclosiloxane formed consists mainly of chain-units of siloxane rings having structures as described in said United Kingdom patent specification, and shown in the accompanying drawing by formulae I, II and III, wherein $R_1 - R_7$ are vinyl groups. They also contain an H- and OH-group in end-positions, so that the chain has an —OH group at each end. The average degree of polymerization lies between 2 and 6 chain units per molecule. The polycyclosiloxane solution has the form of a colorless viscous liquid. The viscosity is reduced by means of a suitable solvent using three parts by weight of methyl isobutyl ketone (2-methylpentanone-4) per part by weight of polycyclosiloxane.

To the polycyclosiloxane solution is added a sensitizer which, according to one embodiment, mainly consists of 2,6-di (4'-azidobenzal)-cyclohexanone, or, according to the other embodiment, consists mainly of 2,6-di(4'-azidobenzal) 4-methylcyclohexanone. These two azido compounds are known per se as ultra-violet sensitizers in photoresist materials based on polycinnamates and cyclisized isoprenes. Formula IV of the drawing shows the chemical compositions of said sensitizers when for $R_8$ a hydrogen atom and a methyl group, respectively, are taken.

In the present example, approximately 10 mg of the sensitizer are added per ml of the 25% polyvinylcyclosiloxane solution.

In order to obtain a silicon oxide pattern on a substrate, for example on a silicon body as a step in the manufacture of semiconductor devices, a film of the polyvinylcyclosiloxane solution with sensitizer is provided on the substrate and the solvent is evaporated from said film. The film is then exposed to ultra-violet radiation in known manner through a suitable mask which has a pattern with radiation-impervious parts to obtain apertures having widths which are at least in the order of magnitude of 3 $\mu$m. The use of exposure times of a few seconds with ultra-violet radiation in irradiation apparatus conventionally used for manufacturing photoresist patterns is sufficient. By a treatment with acetone the unexposed siloxane film parts are dissolved and the exposed film parts remain. By heating in an oxygen-containing atmosphere in a furnace, the remaining siloxane film parts are converted into silicon dioxide. The temperature and the time used are such that the uncovered parts of a silicon substrate are oxidized at most to a small extent. Any very thin oxide layer formed in that case can be removed rapidly, if desired, by means of a dip-etching treatment in a buffered HF solution while maintaining the silicon pattern obtained by conversion of the siloxane substantially throughout its layer thickness.

In the above-described manner, for example, patterns of the polyvinylcyclosiloxane material on silicon are obtained in layer thicknesses of about 6000 A or more. By conversion into silicon dioxide, patterns of silicon dioxide which have a masking effect during diffusion of phosphorus and boron are obtained on the silicon substrate.

EXAMPLE 2

Polymethylcyclosiloxane was used which had been prepared from the methyltrichlorosilane by hydrolysis followed by a treatment with ammonia, similar to that described in United Kingdom patent specification No. 1,316,711. The chain parts are denoted in the drawing by formulae I, II and III, wherein $R_1 - R_7$ are methyl groups.

For further polymerization, use may be made of the available hydroxyl groups when a sensitizer is used which, upon exposure, forms an acid or even better a basic catalyst to form oxygen bridges from the hydroxyl groups. Phenyl-diazoguanidine was used as a sensitizer, and has a formula defined by formula V when $n = 0$ and $R_9$ is hydrogen. By exposure to ultra-violet radiation, said substance forms the rather strong base guanidine which catalyses the reaction for forming oxygen bridges from the available silicon-bonded hydroxy groups.

The following process is used for providing the photosensitive siloxane layer. The polymethylcyclosiloxane is dissolved in methyl isobutyl ketone to form a solution containing 25% by weight of the polymethylcyclosiloxane. Approximately 13 mg of phenyl-diazo-guanidine was added per ml of the said solution. A film of the resulting liquid was applied to a silicon semiconductor surface and the solvent was evaporated from the film. The sensitized polymethylcyclosiloxane-containing film was then patterned in a manner similar to that described in Example 1 by making said film locally insoluble in acetone by means of ultra-violet radiation.

The resulting siloxane pattern may then be converted into a silicon dioxide pattern by oxidation. The radiation sensitivity of the film is approximately the same as that of the sensitized polyvinylcyclosiloxane-containing film used in Example 1, that is to say only a few seconds exposure are required when ultra-violet irradiation apparatus is used which is conventionally used in photoresist methods. These short times are of the same order of magnitude as used with conventional commercially available photoresist materials. The quantity of the sensitizer used in this embodiment is not critical. When the content of the sensitizer is chosen to be considerably lower, for example only 1.3 mg per ml, it appears that the radiation sensitivity is not significantly reduced.

The polysiloxanes used in the above-described Examples have a high silicon content so that the reduction in volume of the layer as a result of the conversion into silicon oxide is small. Said reduction in volume is even smaller for polymethylcyclosiloxane than it is for polyvinylcyclosiloxane.

What is claimed is:

1. A method of providing a patterned silicon containing oxide layer on a substrate, said method comprising applying a coating comprising a polymerizable cyclosiloxane containing methyl groups bonded to silicone and an ultra-violet sensitive sensitizer capable of being converted to a basic reacting form capable of promoting polymerization of the polymerizable cyclosiloxane to an insoluble state in a solvent for the polymerizable cyclosiloxane, exposing desired areas of said coated substrate to ultra-violet radiation to thereby cause polymerization of the polymerizable cyclosiloxane to an insoluble state, treating said surface with a solvent capable substantially only of dissolving unexposed polymerizable cyclosiloxane and then converting the polymerized cyclosiloxane to a silicon containing oxide.

2. A method as claimed in claim 1, characterized in that the sensitizer is a diazoamino compound.

3. A method as claimed in claim 2, characterized in that the amino group belongs to a guanidine group.

4. A method as claimed in claim 3, characterized in that the sensitizer is a phenyldiazoguanidine.

5. The method of claim 4 wherein the phenyldiazoguanidine is a compound of the formula

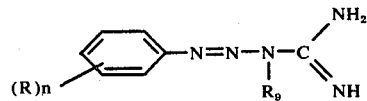

wherein R is a moiety other than hydrogen, $R_9$ is hydrogen or a moiety other than hydrogen and $n = 0, 1, 2$ or 3.

6. A method as claimed in claim 5, characterized in that $R_9$ is hydrogen or a methyl group.

7. A method as claimed in claim 6, in which $n = 1, 2$ or 3, characterized in that the substituents fro $(R)_n$ are alkyl groups having 1 to 20 carbon atoms, alkoxy groups having 1 to 4 carbon atoms, halogens, benzoyl groups or nitrogen-bonded morpholino groups.

8. A method as claimed in claim 1, characterized in that the siloxane material applied to the substrate contains a slightly pre-polymerized cyclosiloxane.

9. A method as claimed in claim 8, characterized in that the degree of polymerization is on an average 2–6 cyclosiloxane groups per poly (cyclosiloxane) molecule.

10. A method as claimed in claim 1, characterized in that the siloxane coating after having been exposed to ultra-violet radiation in accordance with a desired pattern, is covered by a second coating containing a polymerizable siloxane material, and the siloxane material of said second coating is polymerized in accordance with the exposed pattern by graft-polymerization initiated by the irradiated parts of the underlying siloxane coating, said second coating being then developed to be limited to the pattern subjected to graft-polymerization.

11. The method of claim 1 wherein the polymerizable cyclosiloxane contains —OH groups.

12. The method of claim 1 wherein an element other than silicon or oxygen is added to the polymerizable cyclosiloxane containing layer thereby providing the resultant silicon containing oxide layer with said element.

13. A method as claimed in claim 12, characterized in that the element other than silicon or oxygen is added to the coating or siloxane material from a gaseous or liquid phase.

14. A method as claimed in claim 12, characterized in that the element other than silicon or oxygen is added to the siloxane material in the form of a decomposable and/or co-polymerizable compound preceding the application of the coating to the substrate.

15. The method of claim 1 wherein the substrate is at least partially a semiconductor material.

* * * * *